(12) United States Patent  (10) Patent No.: US 6,661,816 B2
Delfyett et al.  (45) Date of Patent: Dec. 9, 2003

(54) MULTIWAVELENGTH MODELOCKED LASERS

(75) Inventors: Peter J. Delfyett, Geneva, FL (US); Hong Shi, Orlando, FL (US)

(73) Assignee: University of Central Florida, Orlando, FL (US)

( * ) Notice: Subject to any disclaimer, the term of this patent is extended or adjusted under 35 U.S.C. 154(b) by 233 days.

(21) Appl. No.: 09/829,759

(22) Filed: Apr. 10, 2001

(65) Prior Publication Data

US 2001/0036209 A1 Nov. 1, 2001

Related U.S. Application Data

(62) Division of application No. 09/096,271, filed on Jun. 11, 1998, now Pat. No. 6,256,328.

(51) Int. Cl.[7] .................................................. H01S 3/10
(52) U.S. Cl. ................................. 372/23; 372/6; 372/18
(58) Field of Search ................................. 372/6, 18, 23

(56) References Cited

U.S. PATENT DOCUMENTS

| 4,435,809 | A | 3/1984 | Tsang | 372/49 |
|---|---|---|---|---|
| 4,446,557 | A | 5/1984 | Figueroa | 372/45 |
| 5,115,444 | A | 5/1992 | Kirkby | 372/50 |
| 5,210,764 | A | 5/1993 | Bucher | 372/23 |
| 5,228,050 | A | 7/1993 | LaCourse | 372/50 |
| 5,276,694 | A | 1/1994 | Wolf | 372/20 |
| 5,276,695 | A | 1/1994 | Scheps | 372/20 |
| 5,319,655 | A | 6/1994 | Thornton | 372/23 |
| 5,347,525 | A | 9/1994 | Faris | 372/19 |
| 5,469,454 | A | 11/1995 | Delfyett, Jr. | 372/25 |
| 5,479,422 | A | 12/1995 | Fermann | 372/18 |
| 5,524,012 | A | 6/1996 | Wang | 372/20 |
| 5,524,118 | A | 6/1996 | Kim | 372/6 |
| 5,546,415 | A | 8/1996 | Delfyett | 372/25 |
| 5,548,433 | A | 8/1996 | Smith | 359/158 |
| 5,555,121 | A | 9/1996 | Dupont | 359/180 |
| 5,561,676 | A | 10/1996 | Goldberg | 372/18 |
| 5,652,763 | A | 7/1997 | Delfyett, Jr. | 372/107 |
| 5,708,672 | A | 1/1998 | Pessot | 372/23 |
| 5,802,086 | A | 9/1998 | Hargis | 372/22 |
| 5,805,623 | A | 9/1998 | Utano | 372/23 |
| 5,878,071 | A | * 3/1999 | Delavaux | 372/18 |
| 5,978,114 | A | 11/1999 | Clark | 359/15 |
| 5,996,020 | A | 11/1999 | Reed | 709/238 |
| 5,999,293 | A | 12/1999 | Manning | 359/139 |
| 6,034,380 | A | 3/2000 | Alphonse | 257/94 |
| 6,081,631 | A | 6/2000 | Brindel | 385/1 |
| 6,097,743 | A | 8/2000 | Alphonse | 372/32 |

OTHER PUBLICATIONS

Farries, M. C. et al., "Tuneable Multiwavelength Semiconductor Laser with Single Fibre Output" Aug. 15, 1991, Electronics Letters, vol. 27, pp. 1498–1499.*

(List continued on next page.)

Primary Examiner—Paul Ip
Assistant Examiner—Cornelius H Jackson
(74) Attorney, Agent, or Firm—Brian S. Steinberger; Law Offices of Brian S. Steinberger

(57) ABSTRACT

Single-stripe GaAs/AlGaAs semiconductor optical amplifiers which simultaneously generates from four to more than twenty tunable WDM channels. A four channel version trsnsmits approximately 12 picosecond pulses at approximately 2.5 GHz for an aggregate pulse rate of 100 GHz. Wavelength tuning over 18 nm has been demonstrated with channel spacing ranging from approximately 0.8 nm to approximately 2 nm. A second version uses approximately 20 wavelength channels, each transmitting approximately 12 picosecond pulses at a rate of approximately 600 MHz. A spectral correlation across the multiwavelength spectrum which can be for utilizing single stripe laser diodes as multiwavelength sources in WDM-TDM networks. A third version of multiple wavelength generation uses a fiber-array and grating. And a fourth version of wavelength generation uses a Fabry-Perot Spectral filter. Also solid state laser sources and optical fiber laser sources can be used.

9 Claims, 13 Drawing Sheets

OTHER PUBLICATIONS

Delfyett, et al., "High–Power Ultrafast Laser Diodes" HEEE Journal of Quantum Electronics, v. 28, No. 10, Oct. 1992.

Fermann, "Environmentally stable Kerr–type mode–locked erbium fiber laser producting 360–fs pulses" Optics Letters, v. 19, No. 1, Jan. 1994.

T. Morioka, et al, "Multi–WDM–Channel, Gbits/s pulse generation from a single lasersource utilizing LD–pumped supercontinuun in optical fibers", Photon.Tech. Lettl., vol. 6,No. 3, 365–368, 1994.

T. Morioka, Multi–WDM–Channel, Gbits/s Pulse Generation from a Single Laser Source Utilizing LD–Pumped Supercontinuum in Optical Fibers, vol. 6 IEEE Photonics, Mar. 1994.

Zhu, Dual–Wavelength Picosecond Optical Pulse Generation Using an Actively Mode–locked Multichannel Grating Cavity Laser, vol. 6, IEEE Photonics, Mar. 1994.

Hong, "Subpicosecond pulse amplification in semiconductor laser amplifies:theorgy and experiment" vol. 30, No. 4, IEEE Journal, Apr. 1994.

C. L. Wang, et al., "Dual–wavelength actively modelocked laser–diode array with an external grating–loaded cavity", Optics Lett., vol. 19, 1456–1458, 1994.

M. C. Nuss, et al., "Dense WDM with femtosecond laser pulse", IEEE/LEOS 1994 Annual Meeting, Boston, MA, 1994.

Lenz, "All–solid–state femtosecond source at 1.5 $\mu$m" vol. 20, No. 11, Optics Letters Jun., 1995.

Mellish, "Diode–pumped CR:LiSAF all–solid–state femtosecond oscillator and regenerative amplifier" Vo. 20, No. 22, Optics Letters, Nov. 1995.

Kopf, All–in–one dispersion–compensating saturable absorber mirror for compact femtosecond laser sources, vo. 21, No. 7, Optics Letters, Apr. 1996.

Tamura, Dispersion–tuned harmonically mode–locked fiber ring laser for self–synchronization to an external clock: vo. 21, No. 24, Optics Letters, Dec. 1996.

Read, "Low–threshold operation of an ultrashort–pulse mode–locked Ti:sapphire Laser", vo. 21, No. 7 Optics Letters, Apr. 1996.

Zhang, "Self–starting mode–locked femtosecond forsterite laser with a semiconductor saturable–absorber mirror", vol. 22, No. 13, Optics Letters, Jul. 1997.

Jung, "Self–starting 6.5–fs pulses from a Ti:sapphire laser", vo. 22, No. 13, Optics Letters, Jul. 1997.

Xu, Ultrabroadband ring oscillator for sub–10–fs pulse generation:, vo. 21 No. 16 Optics Letters, Aug. 1996.

Hong, Femtosecond Self–and Cross–Phase Modulation in Semiconductor Laser Amplifiers, vo. 2, No. 3, IEEE Journal, Sep. 1996.

Aus der Au, "60×fs pulses from a diode–pumped ND:glass laser", vo. 22, No. 5 Optics Letters, Mar. 1997.

Hankla, "Tunable short–pulse beat–wave laser source operating at 1 $\mu$m" vo. 22, No. 22 Optics Letters, Nov. 1997.

Shi, Multiwavelength 10 GH Picosecond Pulse Generation from a Single–Stripe Semiconductor Traveling Wave Amplified Using Active Mode Locking in a External Cavity, OSA/IEEE–LEOS Spring Topical Meeting (Ultrafast Electronics and Optoelectronics, UMB4, Lake Taho, NV, 1997.

Shi, "4×2.5–Gbits/s WDM_TDM laser source based on mode–locked semiconductor lasers" vo. 3075, SPIE, Apr. 1997.

Gee, et al, "Intracavity gain and absorption dynamics of hybrid modelocked semiconductor lasers using multiple–quanturn–well saturable absorbers", Appl. Phys. Lett., 17, (18), pp. 2569–2571, Nov. 3, 1997.

Sorokina, "14–fs pulse generation in Kerr–lens mode–locked prismless Cr:LiSGaF and Cr:LiSAF lasers: observation of pulse self–frequency shift", vo. 22, No. 22, Optics Letters, Nov. 1997.

Mathason, "All–optical clock recovery and dynamics using mode–locked semiconductor lasers", OFC '98 Technical Digest.

Shi, et al., "20 Gbits/s optical WDM transmitter using single–strip multiwavelength modelocked semiconductor laser", Electronics Letters, vol. 34, No. 2, pp. 179–180, Jan. 22, 1998.

P. J. Delfyett, et al, "Intercavity Spectral Shaping in External Cavity Mode–locked Semiconductor Diode Lasers", vo. 4, No. 2 IEEE J. of Quantum Electronics, Mar./Apr. 1998.

T. Morioka, et al, "Multi–WDM–Channel, Gbits/s pulse generation from a single laser source utilizing LD–pumped supercontinuun in optical fibers", Photon.Tech. Lettl., vol. 6, No. 3, 365–368, 1994.

M.C. Nuss, et al., "Dense WDM with femtosecond laser pulse", IEEE/LEOS 1994 Annual Meeting, Boston, MA, 1994.

L. Bovin, et al, "206–channel wavelength division multiplexed transmitter using a single femtosecond laser", OSA/IEEE–LEOS Spring Topical Meeting (Ultrafast Electronics and Optoelectronics, UMB4, Lake Taho, NV, 1997.

D. Burns, et al, "Dual–wavelength external–cavity semiconductor lasers", CLEO'93 Digest, vol. 11 JJHA3, 444–446, 1993.

Zhu, et al, "Dual–wavelength picosecond optical pulse generation using an actively mode–locked multichannel grating cavity laser", Photon. Tech. Lett., vol. 6, No. 3, 348–351, 1994.

C. L. Wang, et al., "Dual–wavelength actively modelocked laser–diode array with an external grating–loading cavity", Optics Lett., vol. 19, 1456–1458, 1994.

P. J. Delfyett, et al, "High–power ultrafast laser diodes", IEEE J. of Quantum Electronics, vol. 28, 2203–2218, 1992.

Gee, et al, "Intracavity gain and absorption dynamics of hybrid modelocked semiconductor lasers using multiple–quanturn–well saturable absorbers", Appl. Phys. Lett., 17, (18), pp. 2569–2571, Nov. 3, 1997.

Shi, et al., "20 Gbit/s optical WDM transmitter using single–stripe multiwavelength modelocked semiconductor laser", Electronics Letters, vol. 34, No. 2, pp. 179–180, Jan. 22, 1998.

Shi et al., Four–wavelength, 10–GHZ pico sencond pulse generation from an active modelocked single–stripe diode laser', Conference proceeding presentation on May 18–23. 1997, 1997 OSA Technical Digest Series vol. 11, Conference on Lasers and Electro–optics (CLEO, 1997).

* cited by examiner

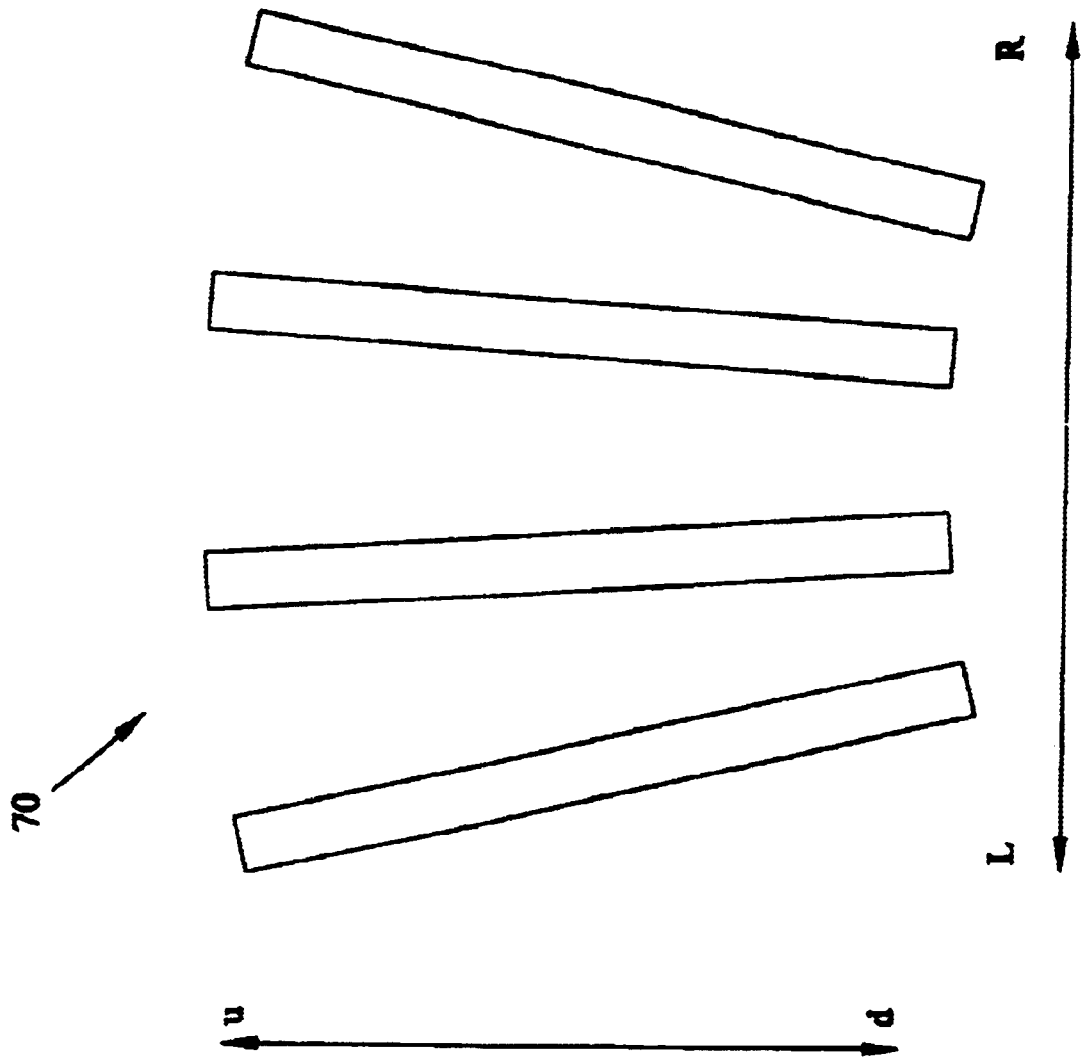

Fig. 5a
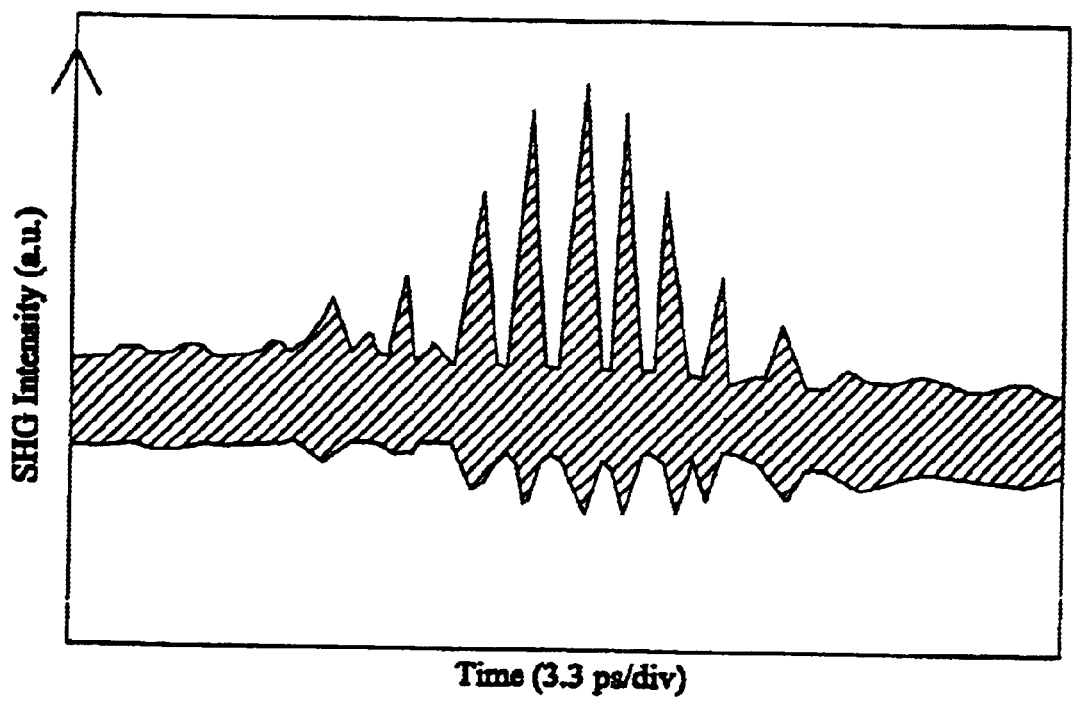
Time (3.3 ps/div)
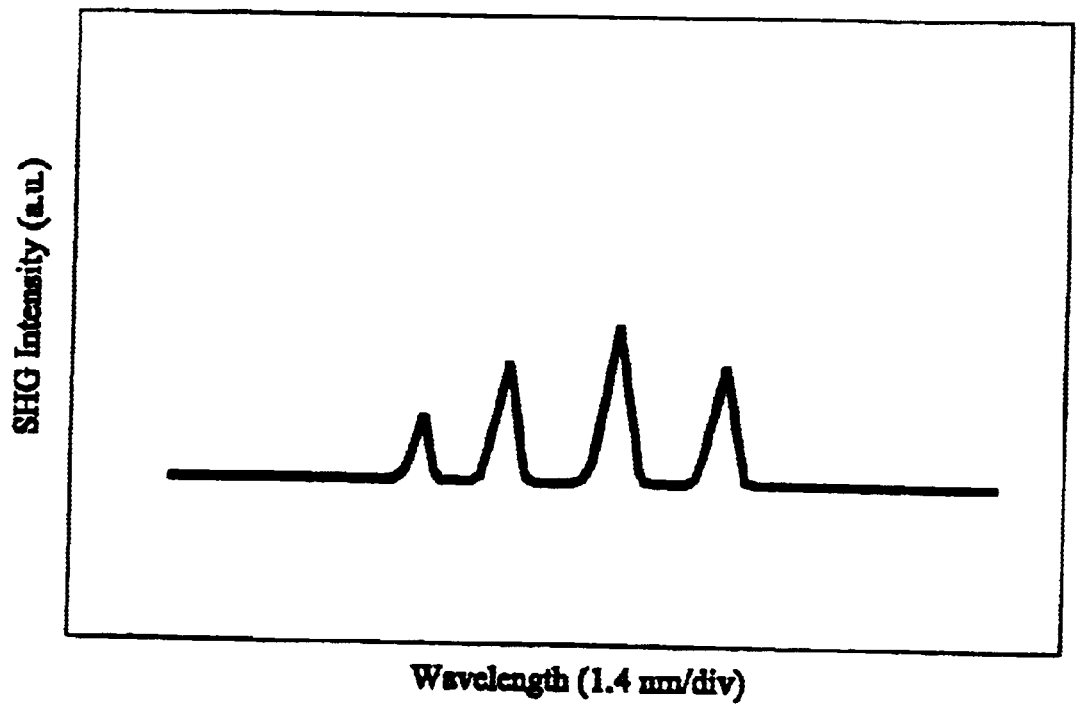
Wavelength (1.4 nm/div)
Fig. 5b

MULTIWAVELENGTH MODELOCKED LASERS

This is a divisional of application Ser. No. 09/096,271 filed Jun. 11, 1998 now U.S. Pat. No. 6,256,328.

This invention relates to lasers, and in particular to a method and apparatus of simultaneously generating up to twenty or more tunable WDM channels using a single-striped Ga As/AlGaAs type semiconductor optical amplifiers. This invention was funded in part by the National Science Foundation ECS contract number 9522267.

BACKGROUND AND PRIOR ART

Multiwavelength optical signal sources capable of generating ultrashort and highly synchronized picosecond pulses are of great interest in novel photonic networks utilizing combined optical wavelength division multiplexed (WDM) and time division multiplexed (TDM) data formats. To date, multiwavelength generation has been demonstrated by either using spectral filtering of femtosecond optical pulses, or semiconductor laser based devices. See T Morioka, K Mori, S. Kawanishi, and M. Saruwatari, "Multi WDM-Channel pulse generation from a single laser source utilizing LD-pumped supercontinuum in optical fibers", PhotonTech. Lett., vol.6, no.3, 365–368, 1994. and M. C. Nuss, W. H Knox, and D. A 13. Miller, Dense WDM with femtosecond laser pulse", IEEE/LOS 1994 Annual Meeting, Boston, Mass., 1994. and L. Boivin, M. C. Nuss J. B. Stark, W. H. Knox, and S. T. Cundiff "206-channel wavelength division multiplexed transmitter using a single femtosecond laser", OSAJ[EEE-LEOS Spring Topical Meeting (Ultrafast Electronics and Optoelectronics), UMB4, Lake Taho, Nev., 1997. and D. Burns, G. Hay, and W. Sibbett, "Dual-wavelength external-cavity semiconductor lasers" CL Q'93 Digest, vol. 11, JTHA3, 444–446, 1993; and Zhu, K. O. Nyairo and I H White, "Dual-wavelength picosecond optical pulse generation using an actively mode-locked multichannel grating cavity laser," Photon. Tech. Lett., Vol.6, No.3, 348–351, 1994. and C. L Wang and C-L Pan, "Dual-wavelength actively modelocked laser-diode array with all external grating-loaded cavity", Optics Lett., vol.19, 1456–1458, 1994.

In these approaches, there are great efforts to try to generate femtosecond optical pulses and a low channel pulse rate. However, these approaches generally suffer from limited wavelength channels, and strong gain competition between the oscillating wavelengths, which is typically characteristic of semiconductor diode lasers.

Furthermore, there have been various patents of general interest in this area that also fail to overcome the problems described above. U.S. Pat. No. 4,435,809 to Tsang et al. describes a passively mode locked laser having a saturable absorber that only has a single wavelength operation mode, with multiple longitudinal modes. U.S. Pat. No. 4,446,557 to Figueroa describes a mode-locked semiconductor laser with tunable external cavity where a user adjusts the cavity length which modifies the longitudinal mode spacing to generate a single wavelength output. U.S. Pat. No. 5,115,444 to Kirkby et al. describes a multichannel cavity laser where each wavelength is generated from a common cavity with each wavelength experiencing a different optical path length. Simultaneous generation of each wavelength is not feasible since the gain competition in the final optical amplifier stage will complicate and prevent simultaneous multiwavelength generation. U.S. Pat. No. 5,228,050 to LaCourse et al. describes an integrated multiple-wavelength laser array, each wavelength having its own cavity that is length adjustable to allow lasing at different wavelengths, and requires an array of lasers for the multiple wavelength generation. U.S. Pat. No. 5,319,655 to Thornton describes a multiwavelength laterally-injecting type lasers which requires the sources to be precisely aligned to one another. U.S. Pat. No. 5,524,012 to Wang et al. describes a tunable, multiple frequency laser diode that uses a multistripe semiconductor laser array to generate several wavelengths, and requires a grazing incidence angle on the diffraction grating. Using the grazing incidence angle prevents simultaneous wavelength generation. U.S. Pat. No. 5,524,118 to Kim et al. describes a wavelength-varying multi-wavelength optical filter laser using a single pump light source, which requires using an erbium doped fiber amplifier. U.S. Pat. No. 5,561,676 to Goldberg describes a compound-cavity high power, tunable modelocked semiconductor laser, that generates a single wavelength output that does not allow for multiple wavelength generation.

Another problem with multichannel generation from femtosecond lasers is that the multiple channels are generated by spectrally filtering the laser output after the optical pulse is generated. This is inefficient because the filtering process eliminates, or throws away, energy that was used in making the optical pulse.

SUMMARY OF THE INVENTION

The first objective of the present invention is to provide an actively modelocked laser with multiple wavelength generation.

The second object of this invention is to provide for multiwavelength generation from a semiconductor diode laser source.

The third object of this invention is to provide for generating multiwavelengths simultaneously from a single stripe semiconductor diode laser source.

The fourth objective is to generate a multiplicity of wavelength channels that can be, but are not necessarily, coherent with each other.

The fifth objective of this invention is to tailor the output spectrum of a pulsed laser by performing filtering inside the cavity (not outside) to increase the overall efficiency of the multiwavelength laser.

The sixth objective is to develop a pulsed multiwavelength laser source that will be appropriate for advanced telecommunications and optical signal processing applications, such as ultrahigh speed optical sampling.

Four embodiments describe tunable multiwavelength modelocked semiconductor lasers based on a single stripe semiconductor optical amplifier (SOA). In a first embodiment, actively modelocking the single-grating-loaded external cavity semiconductor laser system, has approximately four tunable wavelength channels that can be simultaneously generated with each wavelength transmitting approximately 12 ps pulses at approximately 2.5 GHz.

In a second embodiment, actively modelocking a single-grating-loaded external cavity semiconductor laser system has approximately 20 channels that can be simultaneously generated with each wavelength transmitting approximately 12 ps pulses at a rate of approximately 600 MHz. A conventional pulse interleaving configuration multiplexes the output optical pulse train by eight fold to give a final 5 Gbit/s pulse rate. To the inventors knowledge, this is the first demonstration of a single semiconductor laser directly generating approximately 20 wavelengths simultaneously without using a super continuum. The resulting geometry provides a very compact configuration to reach an aggregate data throughput of approximately 100 Gbit/s.

In a third embodiment, a multiple wavelength generation from a single laser source is achieved using a fiber-array and grating. Finally in a fourth embodiment, multiple wavelength generation is achieved from a single laser source using a Fabry-Perot Spectral filter.

Further objects and advantages of this invention will be apparent from the following detailed description of a presently preferred embodiment which is illustrated schematically in the accompanying drawings.

BRIEF DESCRIPTION OF THE FIGURES

FIG. 1b shows a fan shaped filter mask that can be used with the embodiment of FIG. 1a.

The units for FIGS. 2(a–b) are 1.5 nm/div for the X axis, denoted as wavelengths, and the Y axis is in units of "arb units", or arbitrary units.

Figure 1A:
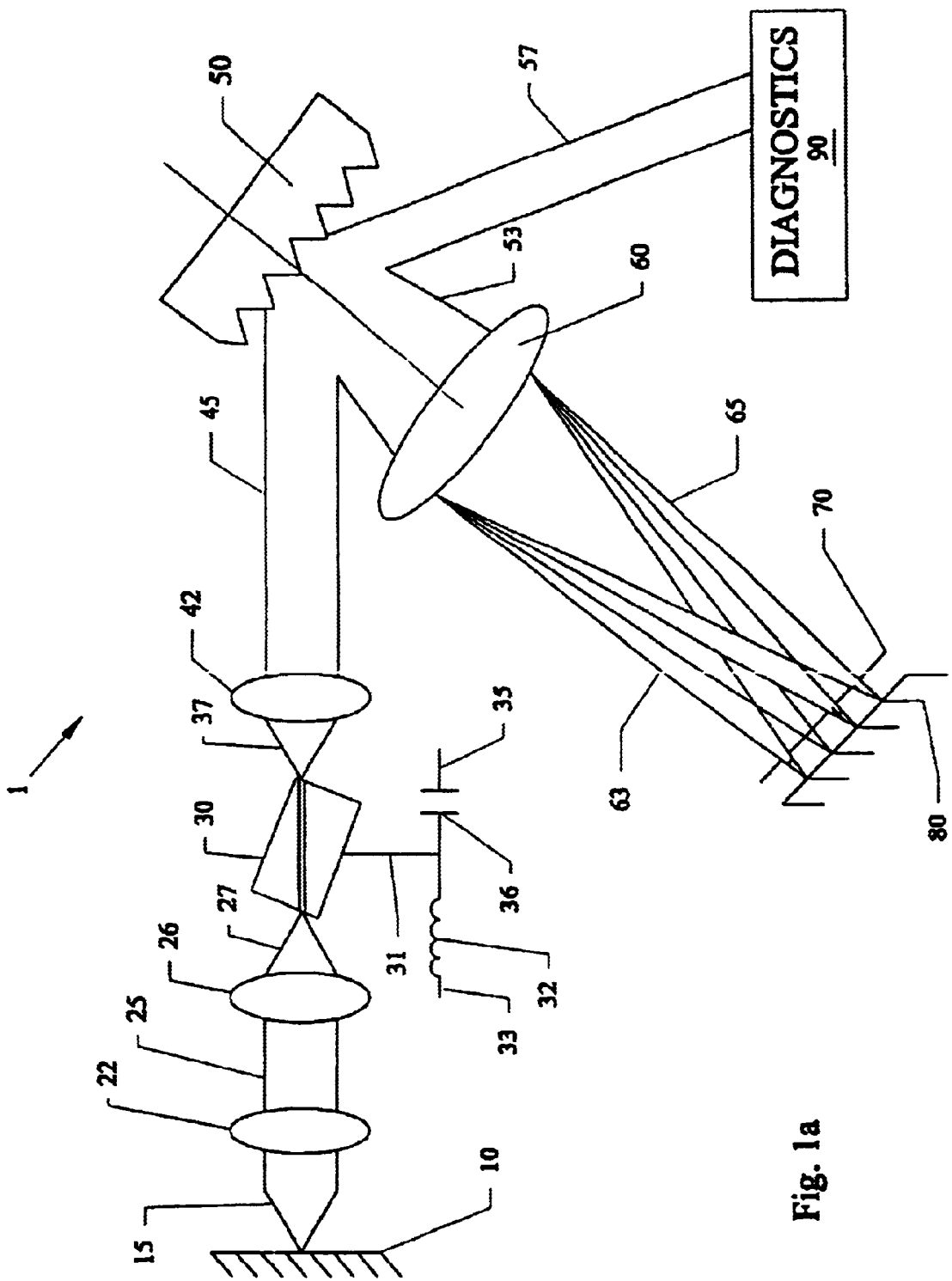
FIG. 1a is a schematic setup of a first embodiment of the multiwavelength modelocked semiconductor diode laser invention for four wavelength channel generation.
Figure 3:
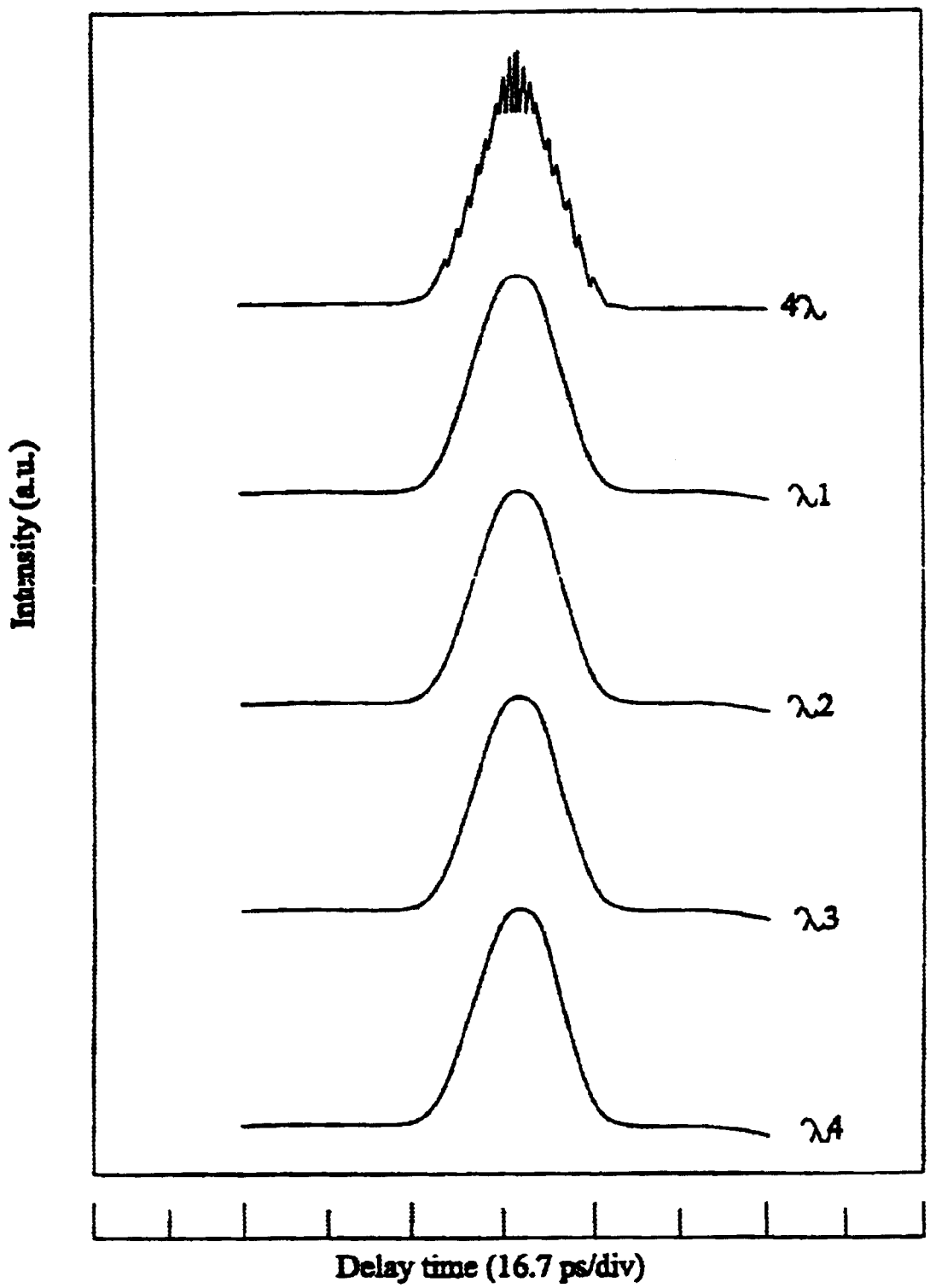

FIG. 3 shows autocorrelation traces of individual output pulse of the laser of FIG. 1a at each wavelength and a composite four-wavelength output, respectively, and pulse duration of 12 psec.

The units for FIG. 3: X axis is delay time is 16.7 picoseconds/div; Y axis: intensity (arb units).

Figure 4A:
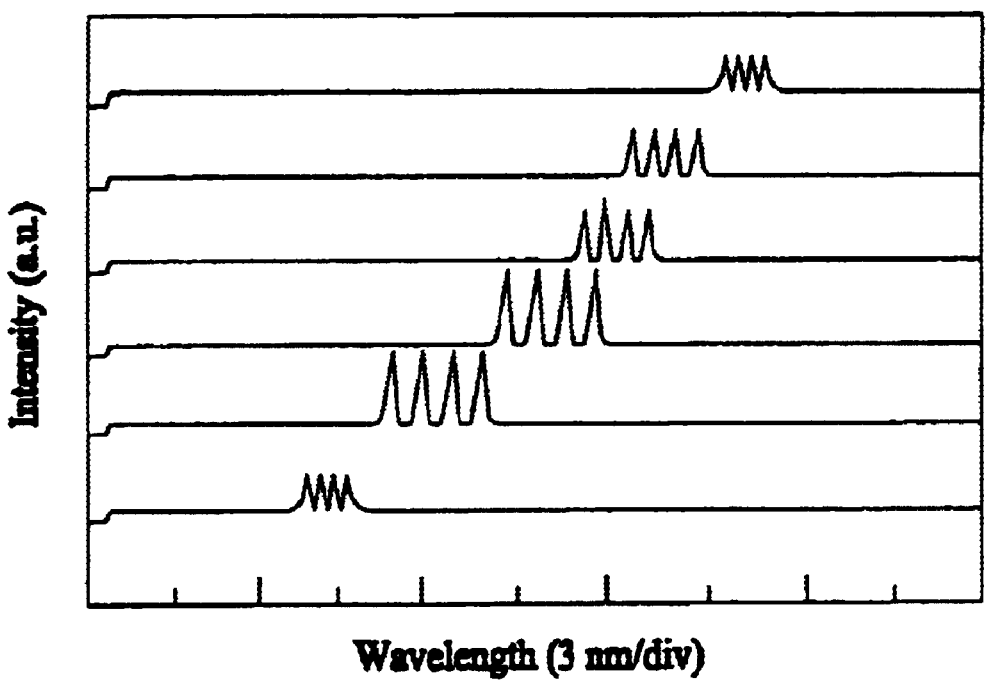

FIG. 4a shows wavelength tuning curves of the laser of FIG. 1a, representing tuning of the center wavelength over 18 nm with constant wavelength separation.

Figure 4B:
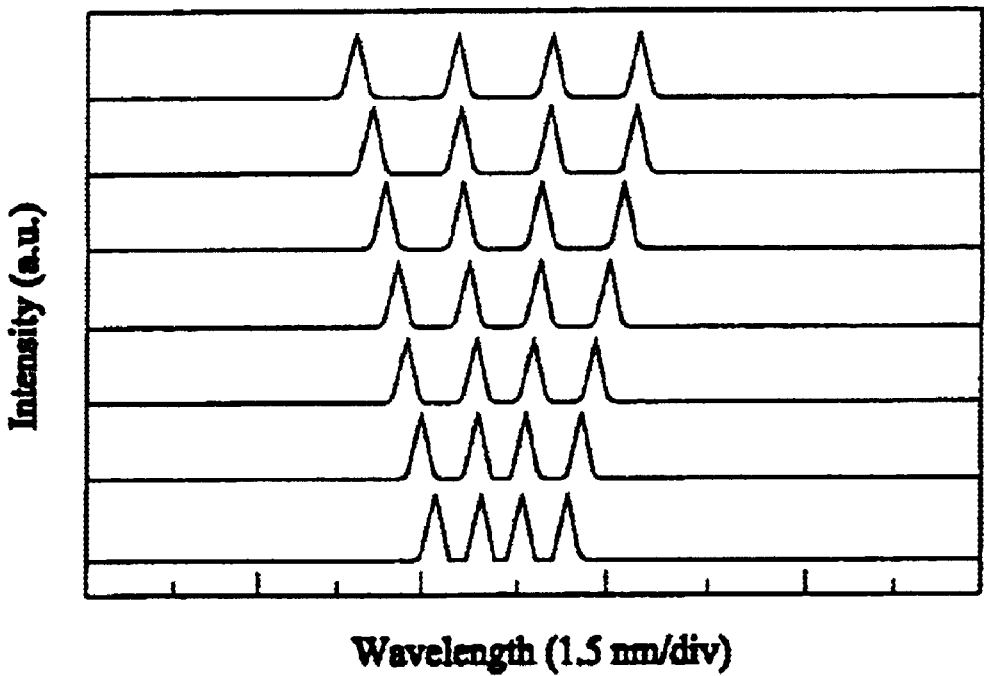

FIG. 4b shows wavelength tuning curves of the laser of FIG. 1a, representing detuning of the wavelength channel spacing from approximately 0.8 nm to approximately 2.1 nm with the center wavelength held constant.

The units for FIGS. 4(a,b) are X axis: wavelength (1.5 nm/div); Y axis: intensity (arb units).

FIG. 5a shows the interferometric autocorrelation of the composite four-wavelength output of the laser of FIG. 1a.

The units for FIG. 5(a) are X axis: Time 3.3 psec/div; Y axis: SHG intensity (arb. units).

FIG. 5b shows the optical spectrum of the laser of FIG. 1a with wavelength channel separation being approximately 1.4 nm.

The units for FIG. 5(b) are X axis: Wavelength (1.4 nm/div); Y axis: intensity (arb. units).

Figure 6:
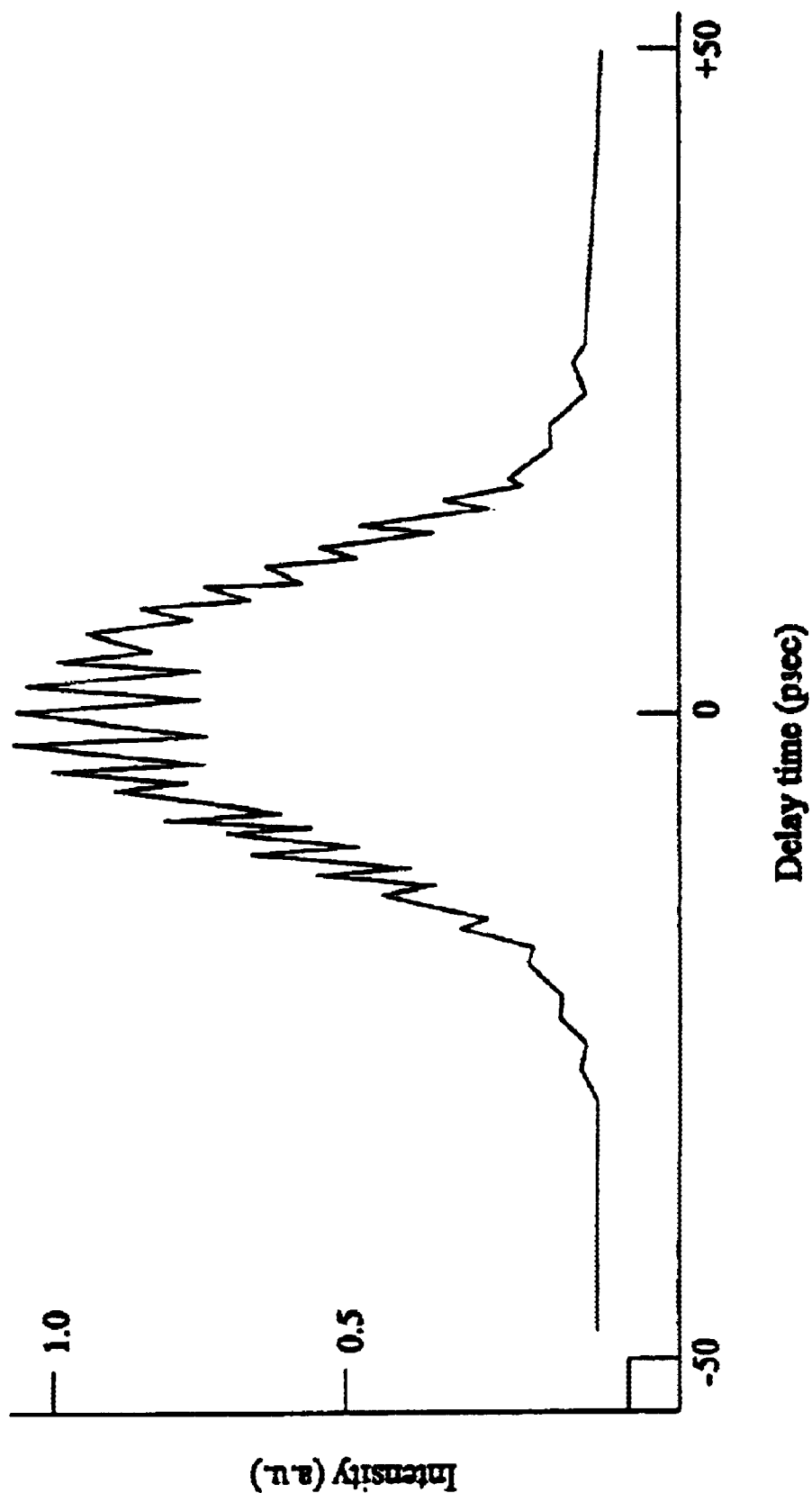

FIG. 6 shows a comparison of the simulation and the experiment data on intracavity phase mismatching effects with the solid line representing experiment data and the broken line representing the simulated curve.

The units for FIG. 6 are X axis: Delay time (psec); Y axis: intensity (arb. units).

Figure 7A:
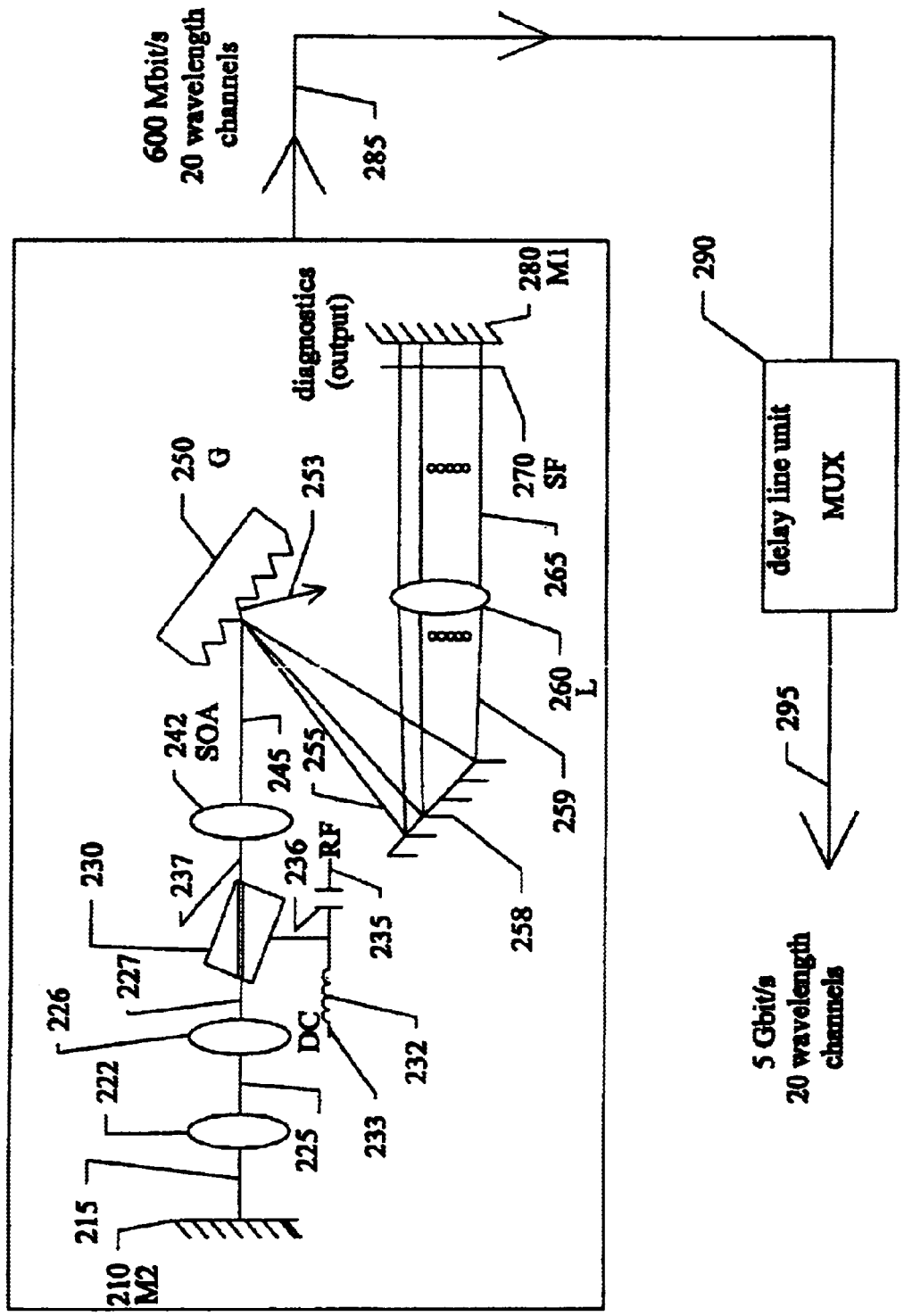

FIG. 7a is a schematic setup of a second embodiment of the multiwavelength modelocked semiconductor diode laser invention for up to 20 simultaneous wavelength channel generation.

Figure 7B:
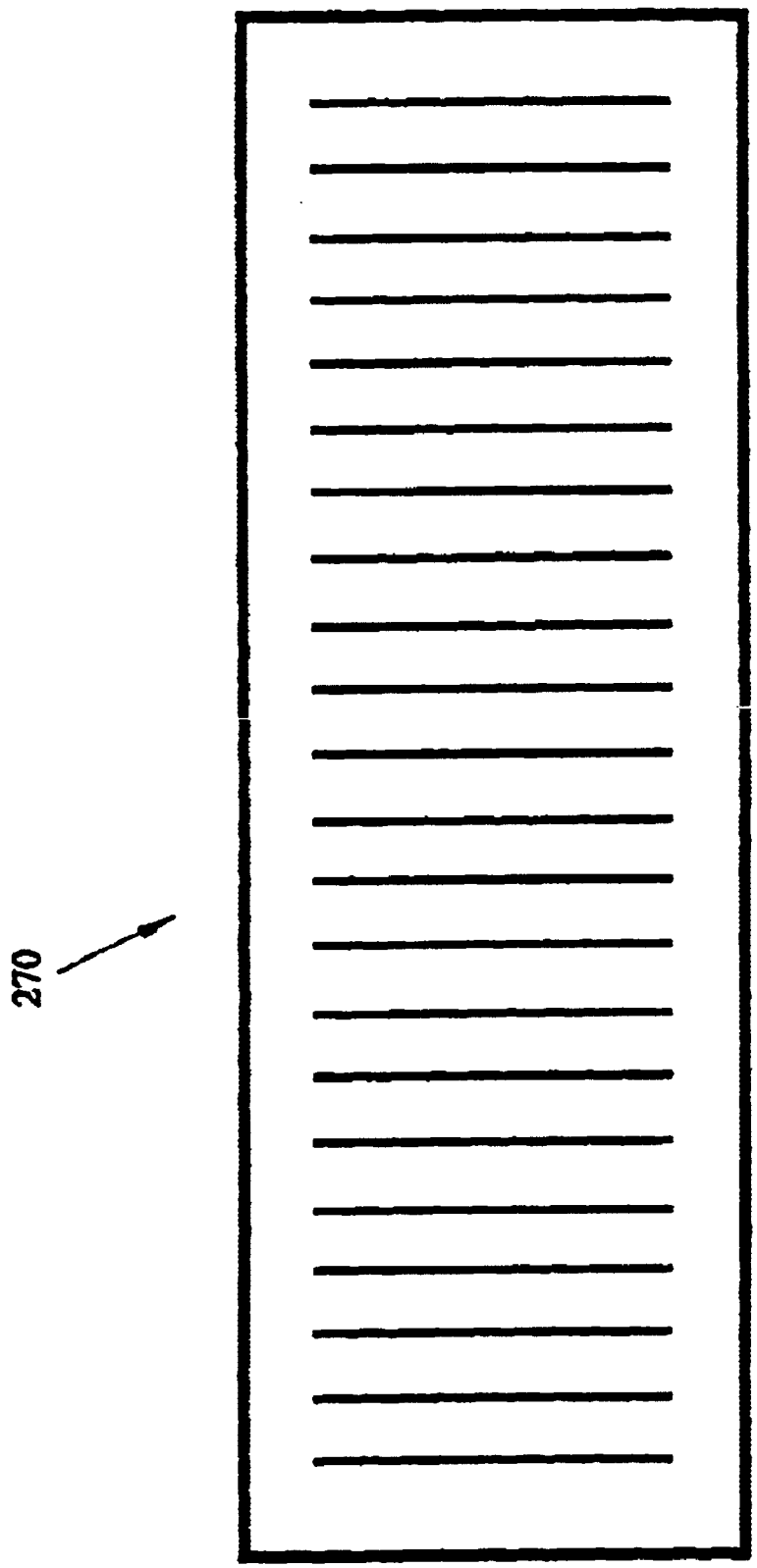

FIG. 7b shows a slit mask that can be used with the embodiment of FIG. 7a.

Figure 8A:
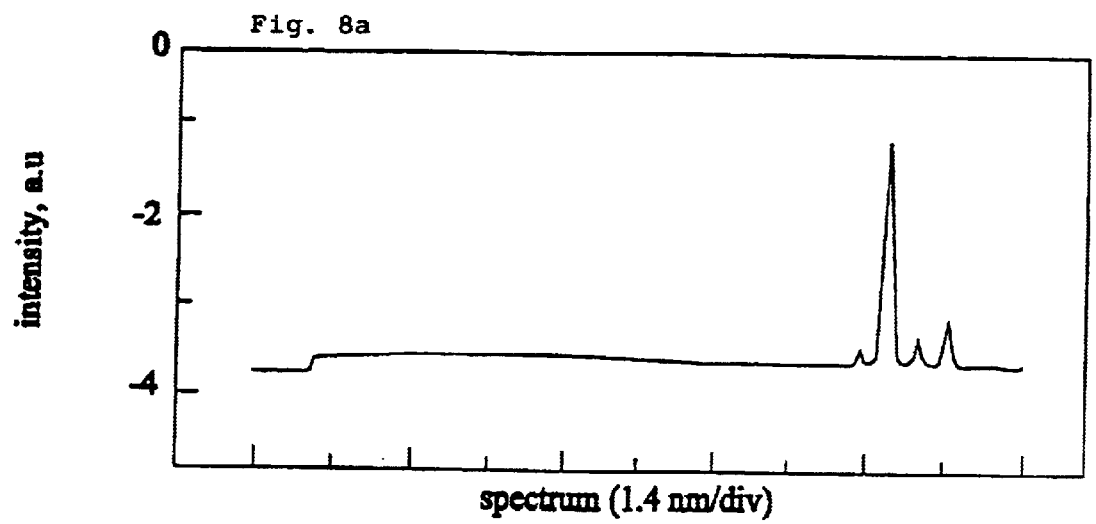

FIG. 8a is a picture of the multiwavelength laser operating in a continuous wave mode (not modelocked).

Figure 8B:
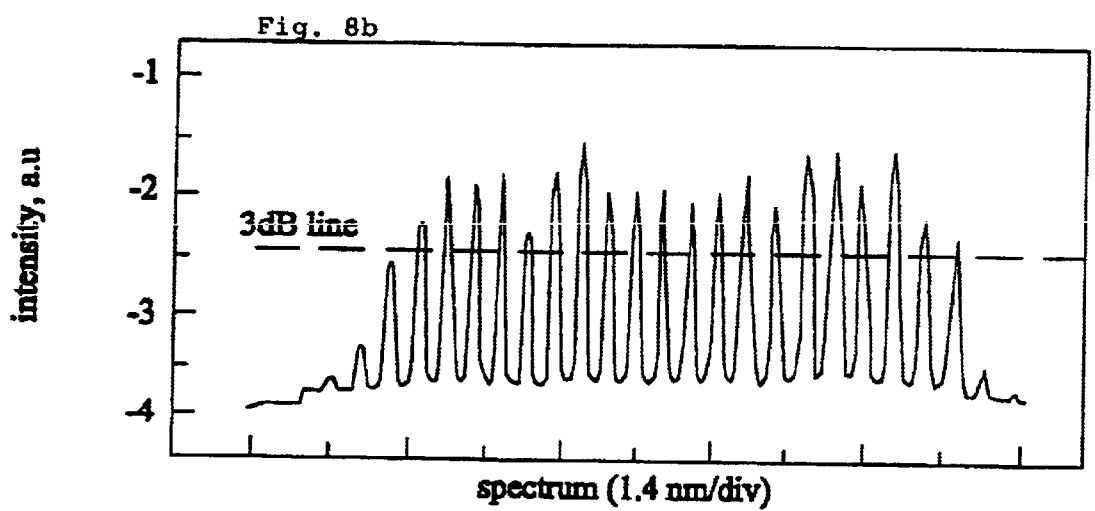

FIG. 8b is the same laser of FIG. 8a operating under modelocked conditions.

FIG. 8a shows a spectra of a conventional single-stripe laser in CW operation.

FIG. 8b shows a spectra of the multiwavelength laser of FIG. 7a in modelocked operation.

Figure 8C:
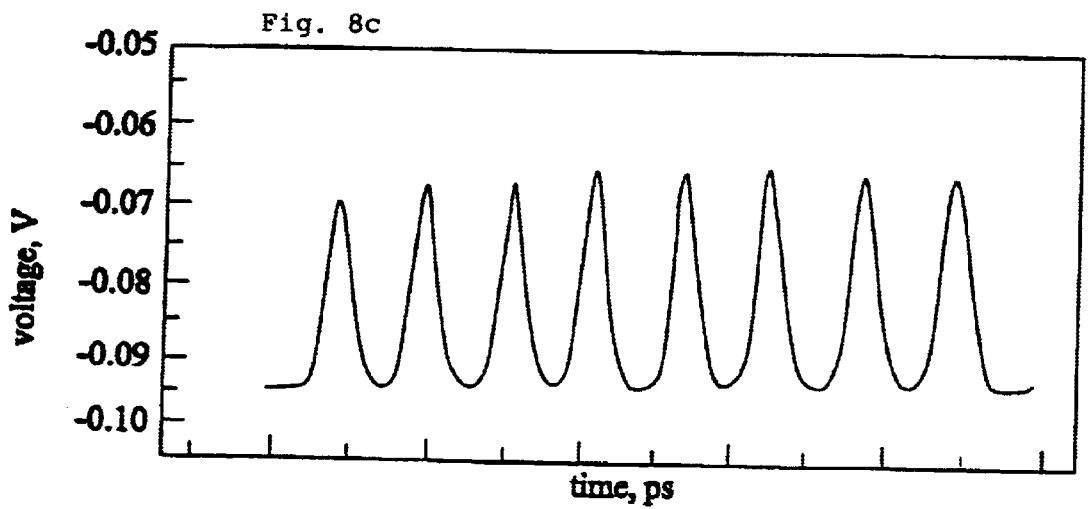

FIG. 8c is an oscilloscope trace of the laser of FIG. 7a showing multiplexed pulse train at 5 Gbit/s.

Figure 9B:
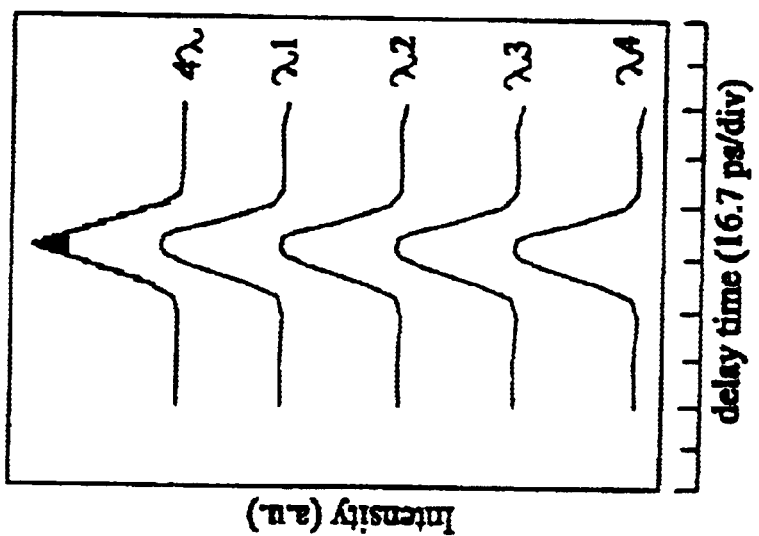
Figure 9A:
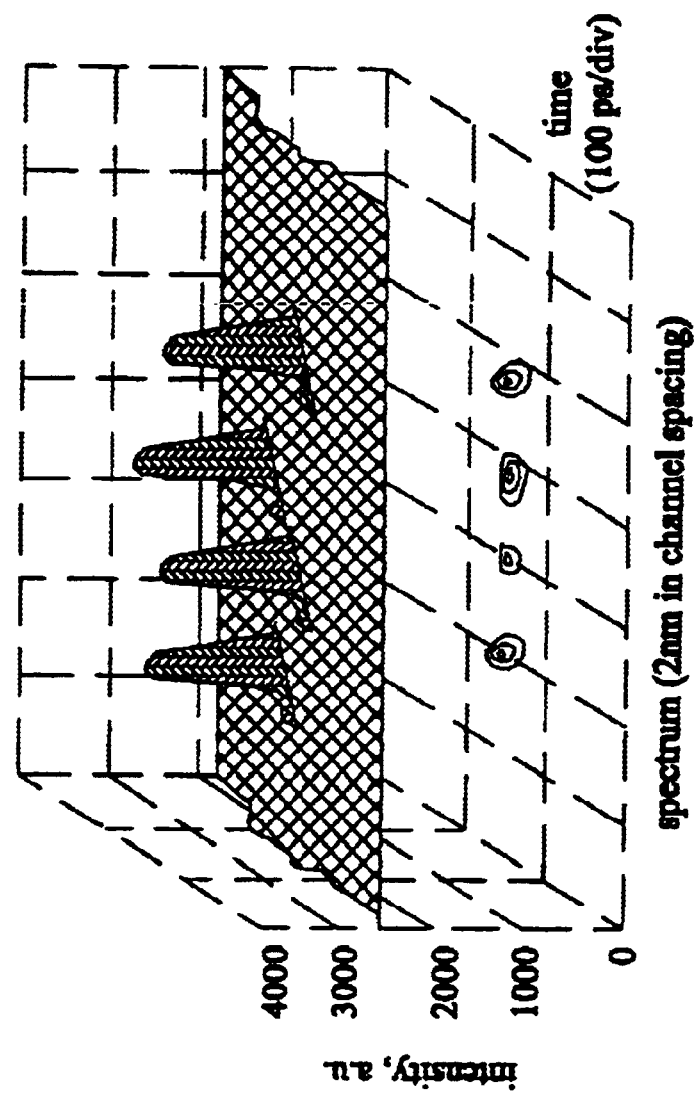

FIG. 9a shows a time-resolved spectrum of the laser of FIG. 7a measured with streak camera.

FIG. 9b shows optical autocorrelation traces of individual output pulse of the laser of FIG. 7a at each wavelength and a composite four-wavelength output, respectively.

Figure 10:
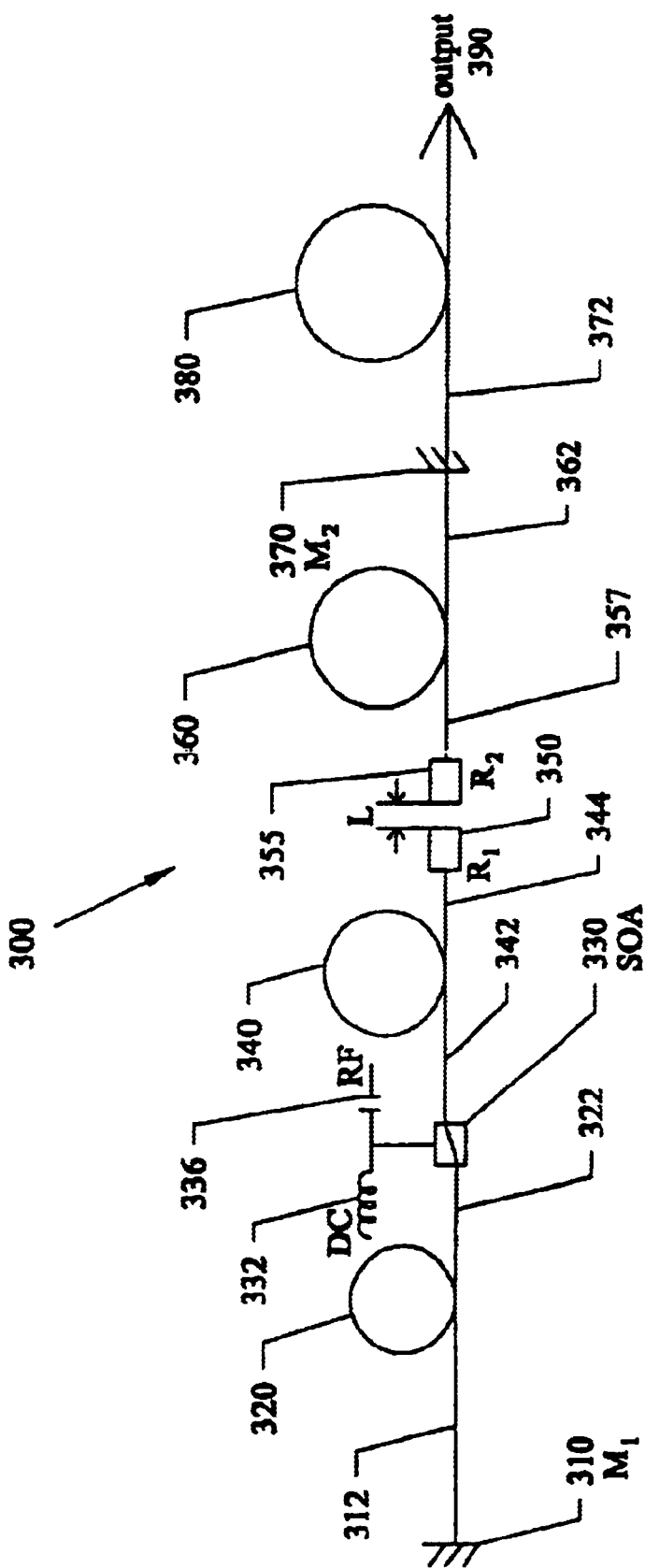

FIG. 10 is a schematic of a third embodiment of the multiwavelength modelocked semiconductor diode laser invention using a Fabry-Perot Spectral Filter.

Figure 11:
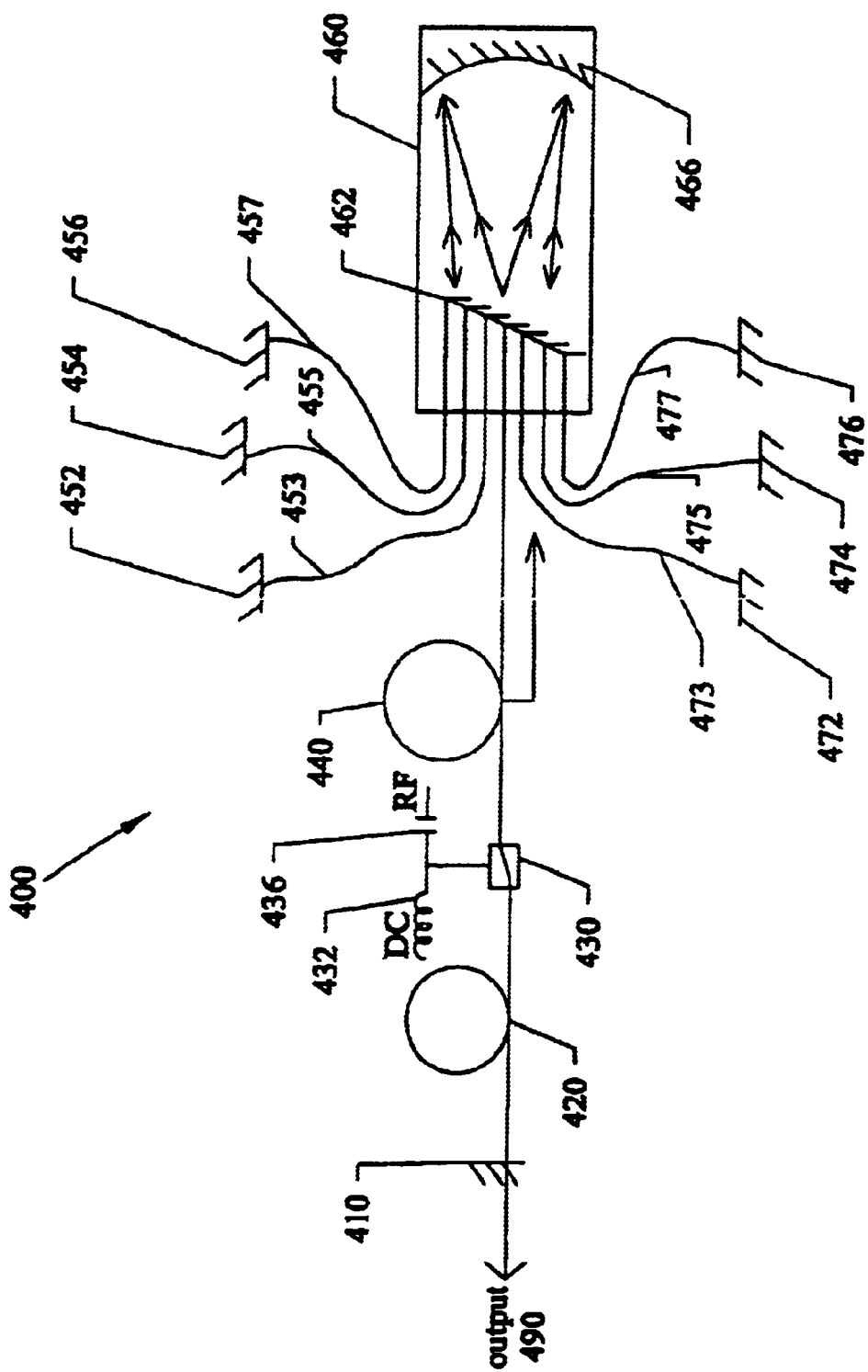

FIG. 11 is a schematic of a fourth embodiment of the multiwavelength modelocked semiconductor diode laser invention using a fiber-array and grating.

DESCRIPTION OF THE PREFERRED EMBODIMENT

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

FIG. 1a is a schematic of a setup 1 of a first embodiment of the multiwavelength modelocked semiconductor diode laser invention, having the SOA, semiconductor optical amplifier 30, such as GaAs (gallium arsenide), AlGaAs (aluminum gallium arsenide), and the like. G grating 50 can be approximately 1800 lines per mm. SF 70 (Spatial filter) is a transmission mask which can be fabricated photographically, or can be construed by fabricating thin slits in a thin, optically opaque medium. The mask can be a transmission mask, a phase mask, or a combination of amplitude and phase masks. Lens 60 can be a 150 mm achromatic lens, end mirrors M2, 10 and M1, 80. Lens 22 can be a 8 mm focal length lens for collimating or focusing the light from a laser diode. Lens 26 can be a 8 mm focal length lens for collimating or focusing the light from a laser diode. Lens 42 can be a 8 mm focal length lens for collimating or focusing the light from a laser diode. Resistor 32 and capacitor 36 are found in commercially available bias tees from Mini Circuits, Hewlett Packard, or Picosecond Plus Labs. (the resistor-cap combination is a "bias tee"). DC bias 33 can be approximately 175 mA, and RF sinusoidal signal 35 can have a frequency of approximately 2.5 GHz. Diagnostics 90 can be a spectrometer and a diode that are used to measure the optical spectrum. Diagnostics 90 can further include a high speed sampling oscilloscope and a high speed photodetector which is used to measure the optical pulse train. Diagnostics 90 can further include an optical autocorrelator, such as a commercially available autocorrelator from Femtochrome, which measures individual optical pulse characteristics.

FIG. 1a schematically shows the setup 1 of the four wavelength laser. Actively modelocked optical pulses are generated from a gain-guided semiconductor optical amplifier SOA, 30 by incorporating an intracavity spectral filter 70 which is defined by grating G-50, lens L-60, and the spatial filter or mask SF-70 to define the individual spectral components. Other types of spectral filters can be alternatively used such as but not limited to a Fabry Perot Etalon, an arrayed waveguide grating, cascaded fiber bragg gratings, cascaded Mach Zehnder wavelength demultiplexers, and fiber-grating wavelength demultiplexers, and the like. Other types of spectral filters can be used inside the cavity to achieve similar functions covered by the novel invention. Examples of filter masks are shown in reference to FIG. 1b.

Referring to FIG. 1a, the end mirror M1 80 reflects the four selected spectral components 63, 65 back to the gain device SOA 30, to complete the four wavelength channel generation. A collinear composite four-wavelength pulse train 57 is coupled out from the zeroth order grating reflection 50 for diagnostics 90. Modelocking is obtained by injecting approximately 1 W of an rf sinusoidal signal 35 at a frequency of approximately 2.5 GHz with approximately 175 mA of dc bias current 33 into 31 the diode chip 30. The filter mask SF-70 is constructed as a pure amplitude mask with a fan geometry, in order to realize continuous wavelength tuning from approximately 0.8 nm to approximately 2.1 nm, is shown in FIG. 1b. The operation of the FIG. 1a will now be described.

Referring to FIG. 1a, light 27, 37 is generated in SOA with dc bias current 32. The light 25, 45 is collected and collimated by lens 26 and lens 42. Light 15 is focussed on to mirror M2-10 using lens 22. This light is then reflected back into the gain medium by retracing the optical path 15, 25. Light 45 from 42 is directed to grating G-50. The diffracted light is directed to the spectral filter which is composed of lens 60, spatial filter 70, and mirror M1-80. The specularly reflected light(the zeroth order diffracted light) is sent to diagnostics-90. The reflected light from mirror M1-80 is directed back into the gain element 30 by retracing the optical path. This completes the optical cavity. The bias current 32 is increased to 175 mA to bring the laser cavity close to the lasing threshold. An additional RF current is applied to modulate the gain at a rate that is inversely proportional to the round trip time. This additional current establishes modelocking. The four wavelengths are defined by the optical filter. As modelocking occurs, it is transient unsaturated gain which allows the simultaneous production of the multiple wavelengths. When the wavelengths are equally spaced, nonlinear four wave mixing occurs in the SOA chip 30 which produces four wave mixing components that are injected into the lasing wavelengths. This effect contributes to establishing a phase relation between the independent channels.

Figure 2A:
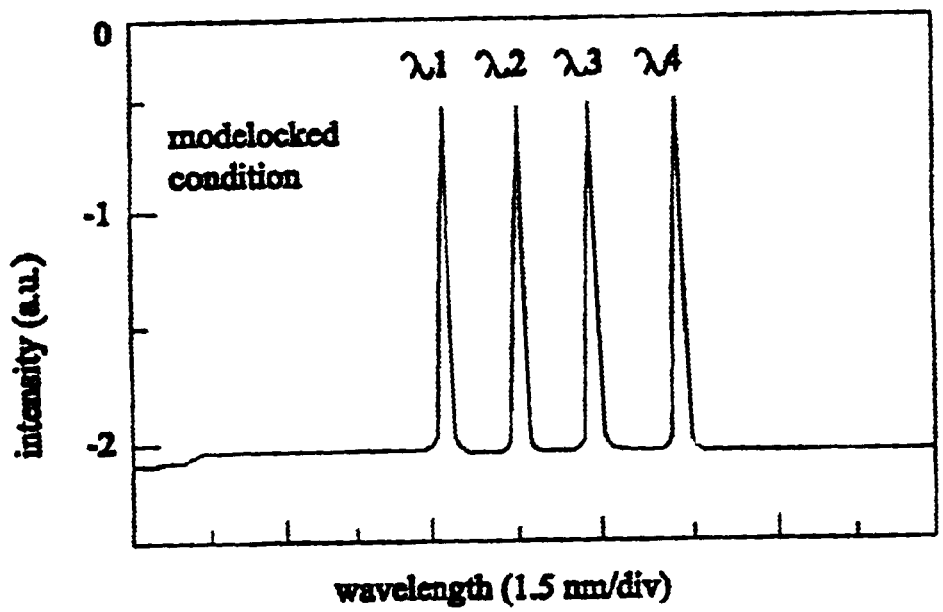
FIG. 2a shows an output spectra of the four-wavelength laser of FIG. 1A in a modelocked operation.
Figure 2B:
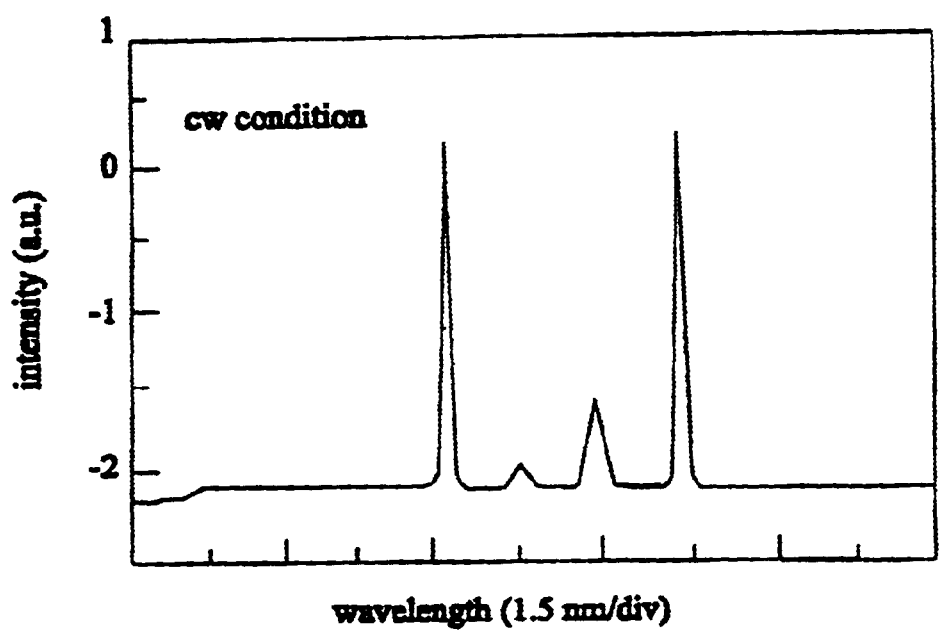
FIG. 2b shows an output spectra of the four-wavelength laser of FIG. 1A in a CW(continuous wave) operation.

FIG. 2a shows an output spectra of the four-wavelength laser of FIG. 1a in a modelocked operation. FIG. 2b shows an output spectra of the four-wavelength laser of FIG. 1a in a CW(continuous wave) operation. FIG. 2a shows that multiwavelength operation is obtained when the laser is modelocked. In comparison, FIG. 2b, shows that strong gain competition prevents simultaneous wavelength operation in the cw (continuous wave) mode. The prior art has demonstrated that dual-wavelength operation has been demonstrated in wide-stripe laser diodes, laser diode arrays, and multiple ridge stripe laser diodes in both cw and modelocked regimes. See Zhu et al., "Dual-wavelength picosecond optical pulse generation using an actively mode-locked multichannel grating cavity laser", Photon. Tech. Lett., Vol.6, No.3, 348–351, 1994. and C. L Wang et al., "Dual-wavelength actively modelocked laser-diode array with all external grating-loaded cavity", Optics Lett, vol.19, 1456–58, 1994. On the contrary, the subject invention demonstrates that stable multiwavelength generation $\lambda 1, \lambda 2, \lambda 3, \lambda 4$ in a single-stripe laser diode device can be only achieved through modelocking. The total average output power is approximately 1.4 mW from the multiwavelength laser oscillator, yielding a corresponding average power per channel of approximately 0.3 mW. The side mode rejection ratio is measured to be greater than approximately 30 dB, which gives less than approximately 0.3 $\mu$W background amplified spontaneous emission (ASE) between channels.

FIG. 3 shows autocorrelation traces of individual output pulse of the laser of FIG. 1a at each wavelength and a composite four-wavelength output, respectively, and pulse duration of 12 psec. FIG. 3 shows that the temporal optical pulse is characterized by intensity autocorrelation techniques that measures the temporal intensity optical pulse characteristics, or in other words, infers the optical pulse duration of the generated optical pulse. These techniques can employ a modified Michelson interferometer and a nonlinear second harmonic crystal, and an adjustable delay in one arm of the interferometer. By moving the adjustable delay and monitoring the intensity of the second harmonic light generated from the nonlinear crystal as a function of delay, the optical intensity correlation function is measured. The optical pulse of each individual wavelength component $\lambda 1, \lambda 2, \lambda 3, \lambda 4$ and the composite four wavelength output $4\lambda$ show approximately equal deconvolved pulsewidths of 12 ps each. The peaks impressed on the composite four-wavelength pulse $4\lambda$ represent a correlated phase relation between each wavelength channel, where the temporal modulation is proportional to the wavelength separation between each channel.

The wavelength tuning can be achieved by moving fan-shaped slits vertically and horizontally relative to the spectrum to obtain channel separation and center wavelength tuning, respectively. Such fan shaped slits are shown in FIG. 1b.

Referring to FIG. 1b, moving the mask 70' left L, and right R, tunes the center wavelength of the multiwavelength spectrum. Moving the mask 70' up u, and down d, changes the spacing between the wavelength channels. By proper mask construction one can obtain the appropriate relationship between the mask position and the generated wavelengths. Furthermore, both channel spacing and individual channel wavelength are defined only by the geometry of the laser system, i.e. the mask of the spatial filter 70 and the grating. Therefore, the individual channel wavelength and channel separation can easily be controlled as compared to temperature-dependent refractive index effects common in many WDM devices.

FIG. 4a shows wavelength tuning curves of the laser of FIG. 1a, representing tuning of the center wavelength over 18 nm with constant wavelength separation. FIG. 4a shows the center wavelength tuning of the four wavelength spectrum, with a fixed spectral separation of approximately 1 nm, and tuned over approximately 18 nm of the gain bandwidth of the SOA. This data suggests that as many as 19 wavelengths separated by 1 nm can be supported from this device depicted in FIG. 1a.

Referring to FIG. 4b, the detuning characteristic is shown where the wavelength separation is varied from approximately 0.8 nm to approximately 2 nm with the center wavelength held constant. Notice in both cases shown in FIGS. 4a and 4b, spectral intensities decrease with large detuning, showing the influence of the gain spectrum of the SOA.

FIG. 5a shows the interferometric autocorrelation of the composite four-wavelength output of the laser of FIG. 1a. FIG. 5b shows the optical spectrum of the laser of FIG. 1a with wavelength channel separation being approximately 1.4 nm.

In order to obtain a better understanding of the possible spectral phase correlation between each wavelength, an interferometric autocorrelation was performed for the composite four-wavelength output pulse train, and is shown in FIG. 5a along with corresponding spectrum in FIG. 5b. The well defined subpicosecond beat pulses suggest the potential of phase correlation between each of the four wavelength components. It should be noted that the spectral intensity in FIG. 5b is different from that shown in FIG. 2a. This can be justified that owing to the non-equal spacing of wavelengths arising from the available filter mask, a single tone beat signal can be only observed by adjusting multiwavelength spectrum. Previous prior art experiments by one of the subject inventors have observed the carrier heating and cooling related ultrafast gain dynamics on similar diode devices. See Delfyett et al., "High-power ultrafast laser diodes", IEEE J 3. of Quantum Electronics, vol. 28, 2203–2218, 1992. The subject inventors believe that intraband carrier modulation by the beat signals generates wavelength sidebands at the wavelength channel separation which can influence both the phase and spectral shape of the wavelength channels they overlap.

A numerical simulation was carried out to compare the resultant autocorrelation for the experimentally measured spectra, but incorporating several different phase spectra. In this simulation, the spectral phase is comprised of two terms. The first term is the phase owing to the integrating nonlinearity associated with gain depletion and group velocity dispersion. See Delfyett et al., "High-power ultrafast laser diodes", IEEE J 3. of Quantum Electronics, vol. 28, 2203–2218, 1992. This term is composed primarily of quadratic and cubic phase at each spectral component, equal to $1.32\pi_{p\text{-}p}$ and $0.1\pi_{p\text{-}p3}$, respectively. The second term is also associated with a quadratic phase of $0.8\pi_{p\text{-}p3}$, however, this term is owing to the phase delay impressed by the intracavity spectrometer. Non-uniform wavelength separation resulting from the imperfect spatial filter is also considered, which has experimental values of 576.6 GHz, 511.7 GHz, and 567.6 GHz for the three separations respectively.

FIG. 6 shows a comparison of the simulation and the experiment data on intracavity phase mismatching effects with the solid line representing experiment data and the broken line representing the simulated curve. The simulation line suggests that the group delay induced by the grating and the nonuniform wavelength spacing are the key factors that influence the temporal beating features, provided that four wavelength components have a similar chirp.

By taking advantage of the active modelocking induced transient unsaturated gain, the subject inventors demonstrate simultaneous generation of four synchronized WDM wavelength channels by utilizing low-cost single stripe semiconductor laser diodes, as shown in FIGS. 1–6. Each of the four channels can transmit 12 picosecond pulses at 2.5 GHz for an aggregate pulse rate of 10 GHz. The output power per channel was 0.3 mW with less than 0.3 μW between channels. The spectral separation of four wavelengths can be tuned from approximately 0.8 nm to approximately 2.1 nm. and the center wavelengths can be varied over approximately 18 nm. The tuning characteristics suggest that additional channels can be produced based on this approach. The ultrafast temporal modulation also suggests that the intracavity dynamics play a role in establishing phase correlation across the composite four-wavelength spectrum. These results show that modelocked single-stripe diode lasers can be useful sources for novel WDM-TDM networks.

FIG. 7a is a schematic of a setup of a second embodiment of the multiwavelength modelocked semiconductor diode laser invention. The components of FIG. 7a will now be described. SOA, semiconductor optical amplifier 230, can be a GaAs (gallium arsenide), AlGaAs (aluminum gallium arsenide), and the like. G grating 250 can be approximately 1800 lines per mm. Spatial filter, SF 270 can be a spatial transmission mask with variable intensity transmission, variable phase delay (or optical path length) or a combination of both amplitude and phase variation. Lens, L 260 can be a 150 mm achromatic lens, end mirrors M2, 210 and M1, 280. Lenses 222, 226, and 242 can be an 8 mm achromatic. Resistor 232 and capacitor 236 can be configured as a bias tee, such the ones manufactured by Mini Circuits. DC bias 233 can be approximately 172 mA. RF sinusoidal signal 235 can have a frequency of approximately 600 MHz. Component 258 can be a broadband reflective mirror. Multiplexer 290 can be configuration of 3 cascaded modified Michelson interferometers, or any type of optical splitters such as but not limited to beam splitters, and the like. Multiplexer 290 can further be an optical delays such as but not limited to retroreflecting corner cubes with mechanical position stages, and the like. Multiplexer 290 can further be an optical recombiners such as but not limited to beamsplitters, recombiners, and the like.

FIG. 7a schematically shows the setup 200 of actively modelocked optical pulses generated from an angled-strip GaAs/AlGaAs SOA 230 by incorporating an intracavity spectral filter 270 to define the individual spectral components. The end mirror M1 280 reflects the selected spectral components back to the gain device 230 to complete the multiple wavelength generation. A co-linear composite multiwavelength pulse train is coupled out from the zeroth order grating reflection 250 for diagnostics. Modelocking occurs by injecting approximately 1 W of an RF sinusoidal signal 235 at a frequency of approximately 600 MHz with approximately 172 mA of DC bias current 233 into the diode chip 230, while diode chip 230 is impedance-matched for optimum power delivery.

FIG. 7b shows the filter mask 270 that can be used with the embodiment 200 of FIG. 7a The filter mask 270 can be constructed as a pure amplitude mask with more than 20 slits to accommodate 20 wavelength channels with wavelength spacing of approximately 0.52 nm. Referring to FIG. 7a, the black lines represent areas where light can pass through the mask. The horizontal direction is parallel to the direction of spectral dispersion determined by the grating; the vertical direction is perpendicular to the dispersion plane determined by the grating. The operation of the components in FIG. 7a will now be described.

Referring to FIG. 7a, light is generated in SOA 230 with dc bias current 232. The light 227, 237 is collected and collimated by lenses 226 and 242. Light is focussed on to mirror M2-210 using lens 222. This light is then reflected back into the gain medium by retracing the optical path. Light from 242 is directed to grating G-250. The diffracted light is directed to the spectral filter which is comprised of lens 260, spatial filter 270, and mirror M1-280. The specularly reflected light(the zeroth order diffracted light) is sent to the diagnostic 253. The reflected light from mirror M1-280 is directed back into the gain element 230 by retracing the optical path. This completes the optical cavity. The bias current 233, passed through cap 232 is increased to 175 mA to bring the laser cavity close to lasing threshold. An additional RF current 235 is applied to modulate the gain at a rate that is inversely proportional to the round trip time. This additional current establishes modelocking. The twenty wavelengths are defined by the optical filter. As modelocking occurs, it is transient unsaturated gain which allows the simultaneous production of the multiple wavelength. When the wavelengths are equally spaced, nonlinear four wave mixing occurs in the SOA chip 30 which produces four wave mixing components that are injected into the lasing wavelengths. This effect contributes to establishing as phase relation between the independent wavelength channels. The zeroth reflection 253 is also used as the output 285. The light is then passed through the multiplexer unit 290 to increase the pulse repetition frequency.

FIG. 8a shows a spectra of a single-stripe laser in CW(continuous wave) operation. FIG. 8b shows a spectra of the multiwavelength laser of FIG. 7 in modelocked operation. As shown in FIGS. 8a–8b, active modelocking is shown to be required for simultaneously generating multiple wavelength channels. In comparison, strong gain competition prevents simultaneous multiwavelength operation in the CW mode. Owing to the transient unsaturated gain associated with mode-locked operation, the gain competition is greatly reduced over a broad spectral range by the modelocking process. See Gee et al., "Intracavity gain and absorption dynamics of hybrid modelocked semiconductor lasers using multiple-quantum well saturable absorbers", Appl. Phys.Lett., 1997, 17, (18), pp. 2569–2571. It is important to note that since both the channel spacing and the individual channel wavelength are defined only by the geometry of the laser system(i.e. the mask of the spatial filter and the grating), the individual channel wavelength and channel separation can easily be controlled separately as compared to temperature-dependent refractive index effects common in WDM devices.

FIG. 8c is an oscilloscope trace of the laser of FIG. 7 showing multiplexed pulse train at 5 Gbit/s, with each pulse containing approximately 20 wavelengths. This experiment used a 20 GHz bandwidth sampling scope and a 10 GHz bandwidth photodetector. The pulsewidth of 12 ps from optical autocorrelation suggests that higher multiplexing data rates are feasible.

In addition, the temporal characteristics of the multwavelength laser show a unique feature in the output(i.e. a correlated timing jitter, or temporal synchronization), between each wavelength. To show this, the subject inventors measured both the time-resolved spectral output with a picosecond streak camera and the optical pulse autocorrelation at each wavelength and a composite four-wavelength output, as illustrated in FIGS. 9a and 9b, respectively. FIG. 9a shows a time-resolved spectrum of the laser of FIG. 7 measured with streak camera.

Referring to FIGS. 9a–9b, we limited the laser operation to four wavelengths with a well separated wavelength spacing of 2 nm to facilitate measurement. This was done to clearly resolve the temporal and spectral characteristics of the multiwavelength output. Referring to FIG. 9a, the instantaneous spectrum and time domain image shows that all wavelengths are temporally synchronized(i.e. no significant skew and relative jitter between different wavelength components). Referring to FIG. 9b, the key attribute in the correlation trace is the identical pulsewidth between each individual wavelength component and the composite multiwavelength output. This shows that any random timing jitter and skew between each wavelength signal is highly correlated, since uncorrelated jitter and temporal skew would broaden the composite autocorrelation trace owing to the temporal overlapping of different wavelength component. This unique temporal synchronization and correlated jitter comes form the nature of multiwavelength generation (i.e, each wavelength channel shares a common RF and DC driving source and a common cavity). Thus, all wavelengths simultaneously experience the same cavity perturbations, as compared to techniques which generate different wavelengths from independent gain media and independent devices. Examples of independent gain media can include laser gain media which are different separate entitities(e.g. vertical cavity surface emitting lasers, semiconductor laser arrays, or independent laser media sharing the same cavity or part of a cavity). Other examples include separate devices such as individual edge emitting lasers, an array of individual lasers, and the like.

Referring to FIG. 9b, another important attribute in the correlation trace is the temporal modulation impressed on the composite four-wavelength pulse. The modulation is inversely proportional to the frequency difference between each channel. The observation of this temporal modulation suggests a wideband spectral coherence between each wavelength channel. The enabling physical mechanism is a nonlinear four-wave mixing in the multiwavelength spectrnm, which exchanges energy between each channel, and establishes correlation.

Referring to FIGS. 7–9b, a 20 wavelength optical transmitter is based on a modelocked semiconductor laser. Robust multiwavelength operation is obtained with each wavelength channel transmitting 12 ps pulses at 5 Gbit/s for an aggregate rate of 100 Gbit/s.

FIG. 10 is a schematic of a third embodiment 300 of the multiwavelength modelocked semiconductor diode laser invention using a Fabry-Perot Spectral Filter. Mirror Ml, 310 can be a highly reflecting metal dielectric mirror butt coupled to the fiber, it can be a fiber bragg grating, it can be a cleaved fiber with a metalic or dielectric coating deposited on the end of the fiber. Optical fibers 320, 340, 360 can be standard single mode fiber, multimode fiber, single mode polarization fiber, dispersion tailored, fiber, and the like. SOA 330, DC bias 332, and RF 336 can be equivalent to those described in the previous embodiments. R1 350 and R2 355 can be reflective surfaces with an adjustable gap L, where L is the distance between the two reflective surfaces. The values of the reflectivities can vary between 0 and 100 percent. The gap L can vary between approximately 0 mm to approximately 10 mm and greater. Mirror M2 can be a partially reflective output coupler, which can be partially transmitting metal or dielectrice mirror which is butt coupled to the end of a cleaved fiber, it can be a fiber bragg grating, it can be a cleaved fiber with a metalic or dielectric coating deposited on the end of the fiber. Output 390 can be directed to a telecommunication system, a digital signal processing system, an analog to digital converter, a digital to analog converter, an optical sampling system, a computer interconnect network. The operation of FIG. 10 will now be described.

Referring to FIG. 10, the optical fibers 320 to 360 with mirrors M1 and M2 make up an optical cavity with a gain element SOA 330. The laser can be actively modelocked using the DC and RF currents 332 and 336. The fabry perot etalon, which is comprised of reflectores R1, R2 and gap L, serve as the spectral filter that allows the production of a multiplicity of wavelength channels. The output is taken from the output port 390.

FIG. 11 is a schematic of a fourth embodiment 400 of the multiwavelength modelocked semiconductor diode laser invention using a fiber-array and grating. Mirror M1, 410 can be a partially reflective output coupler, which can be partially transmitting metal or dielectrics mirror which is butt coupled to the end of a cleaved fiber, it can be a fiber bragg grating, it can be a cleaved fiber with a metalic or dielectric coating deposited on the end of the fiber.

Optical fibers 420, 440 can be standard single mode fiber, multimode fiber, single mode polarization fiber, dispersion tailored, fiber, and the like. SOA 430, DC bias 432, and RF 436 can be equivalent to those described in the previous embodiments. Mirrors 452, 454, 456 can each be a highly reflecting metal dielectric mirror butt coupled to the fiber, it can be a fiber bragg grating it can be a cleaved fiber with a metalic or dielectric coating deposited on the end of the fiber. Fiber-grating WDM-DeMUX 460 includes a diffraction grating 462, a reflective mirror 466 and housing to contain the grating 462 and mirror 466. Output 490 can be directed to a telecommunication system, a digital signal processing system, an analog to digital converter, a digital to analog converter, an optical sampling system, a computer interconnect network. The operation of FIG. 11 will now be described.

Referring to FIG. 11, the optical fiber 420, 440, with mirrors 452, 454, 456, 472, 474 and 476 make up an optical cavity with a gain element SOA 430. The laser is actively modelocked using the DC and RF currents 432, 436. The WDM demux 460, 462, 466, serve as the spectral filter that allows the production of a multiplicity of wavelength channels. The modelocking produces optical pulses, and the spectral filter produces the many wavelength channels. The output is taken from the output port 490.

The correlated temporal synchronization described in the above embodiments has applications in optical clock recovery and synchronized WDM networks. The optical clock recovery can be a generation of a train of stable optical pulses at a well defined repetition rate by injecting an optical data stream into a passively modelocked laser. The synchronized WDM network can be a network of optical fiber links and switches which use plural wavelengths which are pulsed at a well defined repetition rate to send optical data. The WDM-TDM network is a network of optical fiber links and switches which use many wavelengths which are pulsed at a selected repetition rate and that the optical pulses can be temporally interleaved with each other to send optical data.

Furthermore, the ultrafast temporal modulation shows that intracavity dynamics plays a role in establishing phase coherence across the composite multiwavelength spectrum.

In addition, the above invention shows that modelocked multiwavelength single-stripe diode laser can be useful sources for novel WDM-TDM networks such as those described above.

Although the first two embodiments describe using semiconductor laser diodes such as GaAs and AlGaAs, and the like. Other lasers can be used such as but not limited to optical fiber lasers such as erbium, praesodimium, and the like. Solid state lasers can also be used such as but not limited to YAG, fosterite, LiSAF, and Ti:$Al_2O_3$, and be used. Other semiconductor lasers can also be used such as but not limited to vertical cavity lasers, InP, InGaAs, InGaAsP, GaN, InGaAlN, and the like. Still other semiconductor lasers can be used such as InAlGaAs, and InAlGaP, and the like. Still other lasers can be used such as but not limited to diode pumped lasers, gas lasers, waveguide lasers, and the like.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A multiwavelength laser source, comprising:

an optical fiber cavity formed between two mirrors, the optical fiber cavity having a laser source and an optical fiber within the cavity;

means for actively modelocking the laser source within the cavity; and spectral filter means inside of the optical fiber between the two mirrors having a pair of reflective surfaces separated apart from one another by an adjustable varying gap which varies between a value greater than zero mm to approximately 10 mm, the spectral filter means for simultaneously generating at least twenty tunable separate modelocked wavelengths from the optical cavity of the laser source.

2. The multiwavelength laser source of claim 1, further comprising:

means for generating at least approximately 5 Gbits/s from each of the wavelengths.

3. The multiwavelength laser source of claim 1, further comprising:

means for forming an output from the source having an aggregate rate of at least approximately 100 Gbits/s.

4. A multiwavelength laser source, comprising:

an optical fiber cavity formed between two mirrors, the optical fiber cavity having a laser source and an optical fiber within the cavity;

means for actively modelocking the laser source within the cavity, the means for modelocking includes an rf source having a frequency of approximately 2.5 GHz to approximately 600 MHz and a bias source, the rf source and the bias source being injected into the laser source; and spectral filter means inside of the optical cavity between the two mirrors having a pair of reflective surfaces separated apart from one another by an adjustable varying gap which varies between a value greater than zero to approximately 10 mm, the spectral filter means for simultaneously generating at least twenty tunable separate modelocked wavelengths from the optical fiber cavity of the laser source.

5. The multiwavelength laser source of claim 4, further comprising:

means for generating at least approximately 5 Gbits/s from each of the wavelengths.

6. The multiwavelength laser source of claim 4, further comprising:

means for forming an output from the source having an aggregate rate of at least approximately 100 Gbits/s.

7. A method of generating modelocked multiwavelengths from a device, comprising the steps of:

providing an optical fiber cavity having a single laser source and an optical fiber positioned between two mirrors;

modelocking the single laser source within the optical fiber cavity by injecting the single laser source with an rf source having a frequency of approximately 2.5 GHz to approximately 600 MHz and a bias source; and generating at least twenty tunable separate modelocked wavelengths from a spectral filter means located inside the optical fiber between the two mirrors within the optical fiber cavity, the spectral filter means having a pair of reflective surfaces separated apart from one another by an adjustable variable gap which varies between a value greater than zero to approximately 10 mm.

8. The method of claim 7, further comprising the step of:
generating at least approximately 5 Gbits/s in each of the wavelengths.

9. The method of claim 7, further comprising the step of:
generating an output having an aggregate of at least approximately 100 Gbits/s.

* * * * *